(12) United States Patent
Seo

(10) Patent No.: US 6,190,994 B1
(45) Date of Patent: Feb. 20, 2001

(54) METHOD FOR FORMING A TUNGSTEN UPPER ELECTRODE OF A CAPACITOR

(75) Inventor: Hwan Seok Seo, Ichon (KR)

(73) Assignee: Hyundai Electronics Industries Co., Ltd. (KR)

( * ) Notice: Under 35 U.S.C. 154(b), the term of this patent shall be extended for 0 days.

(21) Appl. No.: 09/340,375

(22) Filed: Jun. 28, 1999

(30) Foreign Application Priority Data

Jun. 26, 1998 (KR) .................................................. 98-24431

(51) Int. Cl.⁷ .................................................. H01L 21/20
(52) U.S. Cl. .................. 438/398; 438/253; 438/243; 438/683; 438/685; 438/768
(58) Field of Search .................. 438/253, 243, 438/142, 768, 758, 683, 685

(56) References Cited

U.S. PATENT DOCUMENTS

| | | | |
|---|---|---|---|
| 4,786,360 | * 11/1988 | Cote et al. ............................ | 156/643 |
| 5,292,673 | * 3/1994 | Shinriki et al. ...................... | 437/42 |
| 5,504,038 | 4/1996 | Chien et al. ......................... | 437/192 |
| 5,612,558 | 3/1997 | Harshfield ............................ | 257/298 |
| 5,939,748 | * 8/1999 | Takaishi .............................. | 257/310 |
| 5,956,594 | * 9/1999 | Yang et al. .......................... | 438/396 |
| 5,956,609 | * 9/1999 | Lee et al. ............................ | 438/627 |
| 5,960,294 | * 9/1999 | Zahurak et al. ..................... | 438/398 |
| 5,966,612 | * 10/1999 | Wu ...................................... | 438/398 |

FOREIGN PATENT DOCUMENTS

| 10032248 | 2/1998 | (JP) . |
|---|---|---|
| 10209280 | 8/1998 | (JP) . |

* cited by examiner

*Primary Examiner*—Matthew Smith
*Assistant Examiner*—V. Yevsikov
(74) *Attorney, Agent, or Firm*—Blakely Sokoloff Taylor & Zafman

(57) ABSTRACT

There is provided a method for forming a capacitor of a semiconductor device capable of preventing a dielectric layer from being damaged in forming a tungsten upper electrode on a dielectic layer, and preventing tungsten siliside from being formed on a tungsten film in the following processes. In the present invention, for protecting a dielectric layer, a polisilicon layer is formed on a dielectric layer as a sacrifical reduction layer. Then, a tungsten seed layer is formed on the dielectric layer by reducing $WF_6$ with the polysilicon layer. After that, a tungsten film to be an upper electrode is formed by subsequently carrying out a deposition process using the reaction of $WF_6$ and $H_2$ or $SiH_4$ Then, for preventing tungsten silicide film from being formed in following thermal process, a thermal process is performed in ammonia($NH_3$) cointaining ambient, or a plasma process using a nitrogen gas or an ammonia gas is performed to nitrize the surface of the tungsten film.

12 Claims, 2 Drawing Sheets

METHOD FOR FORMING A TUNGSTEN UPPER ELECTRODE OF A CAPACITOR

FIELD OF THE INVENTION

The present invention relates to a method for manufacturing a semiconductor device; and, more particularly, to a method for forming a tungsten upper electrode of a capacitor.

DESCRIPTION OF THE PRIOR ART

Recently, a $Ta_2O_5$ film is expected to be dielectric material instead of a NO film or ONO film, since it has a high dielectric constant, a good thermal chemical stability and a good step coverage in chemical vapor deposition(CVD). However, the $Ta_2O_5$ film reacts with a polysilicon layer so that a $SiO_2$ film is formed at the interlayer of the $Ta_2O_5$ film and the polysilicon layer. Therefor, when a $Ta_2O_5$ film is used as a dielectric layer, it is difficult to use polysilicon as an upper and a lower electrodes of a capacitor due to increasing of leakage current.

Accordingly, after a lower electrode is made of a polysilicon layer, a thermal process is performed in a nitrogen containing ambient, whereby the surface of a lower electrode is nitrated. It is considered that material being stable at the location between a $Ta_2O_5$ film and a polysilicon layer and having good electric characteristic is used as an upper electrode. For example, it is disclosed that an upper electrode is formed from a TiN film by a chemical vapor deposition(CVD) method, but, in the method, dielectric characteristic of a $Ta_2O_5$ film is decreased due to interlayer reaction of a TiN film and a $Ta_2O_5$ film. Also, in case of using Pt and $RuO_2$, since they have excellent chemical stability, it is difficult to perform an etching and is poor at step coverage while characteristic of an interlayer is good.

Since a tungsten film which is deposited by CVD method has low resistivity, such as 10 $\mu\Omega$cm, a good step coverage and a good etching characteristic, it scarcely reacts with an oxide layer thermodynamically, and it is easily etched by a reactive ion etching. Accordingly, a tungsten film is suitable to be an upper electrode of a $Ta_2O_5$ film. However, when tungsten is deposited, a $Ta_2O_5$ film is damaged by deposition materials, such as $WF_6$, and in the following process, it reacts with polysilicon to form tungsten silicide.

SUMMARY OF THE INVENTION

An object of the present invention is to provide a method for forming a capacitor to prevent a dielectric layer from being damaged during the formation of a tungsten film on the dielectric layer, and preventing tungsten silicide from being formed on a tungsten film in the following process.

In accordance with one aspect of the present invention, there is provided a method for forming a capacitor of a semiconductor device, the method comprising the steps of: forming a first polysilicon layer on a semiconductor substrate; forming a $Ta_2O_5$ layer on the first polysilicon layer; forming a second polysilicon layer on the $Ta_2O_5$ layer; forming a tungsten seed layer on the $Ta_2O_5$ layer by reducing WF6 with the second polysilicon layer; and forming a tungsten layer on the tungsten seed layer.

In the present invention, for protecting a dielectric layer, a polysilicon layer is formed on the dielectric layer as a sacrificial layer. Then, a tungsten seed layer is formed on the dielectric layer by reducing WF6 with the polysilicon layer. After that, a tungsten film is formed by subsequently carrying out a deposition process using the reaction of $WF_6$ and $H_2$ or $SiH_4$ Then, a thermal process is performed in ammonia ($NH_3$) containing ambient, or a plasma process using a nitrogen gas or an ammonia gas is performed to nitride the surface of a tungsten film for preventing a tungsten silicide film from being formed in the following processes.

BRIEF DESCRIPTION OF THE DRAWINGS

The object, features and advantages of the present invention are understood within the context of the description of the preferred embodiment as set forth below. The description of the preferred embodiment is understood within the context of the accompanying drawings, with which form a material part of this disclosure, wherein.

DESCRIPTION OF THE PREFERRED EMBODIMENTS

FIGS. 1 to 4 show cross-sectional views illustrating a method for forming a semiconductor device in accordance with a preferred embodiment of the present invention.

Figure 1:
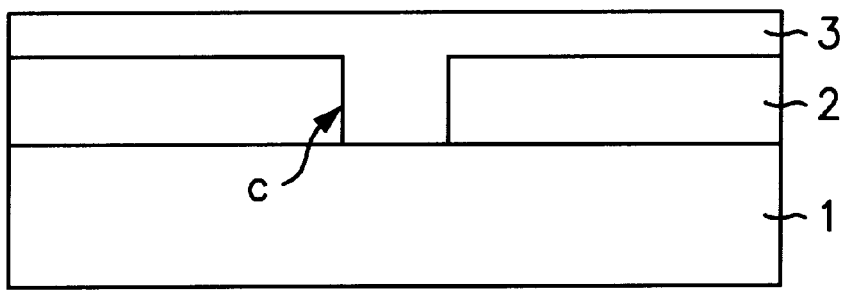
FIGS. 1 to 4 show cross-sectional views illustrating a method for forming a semiconductor device in accordance with the present invention.

As illustrated by FIG. 1, an insulating layer 2 is formed on the semiconductor substrate 1. The insulating layer 2 is selectively etched to form a contact hole C, thereby exposing a portion of the semiconductor substrate 1. Thereafter, a first polysilicon layer 3 is formed on the semiconductor substrate 1 to form a lower electrode, wherein the lower electrode is electrically connected to the semiconductor substrate 1 through the first polysilicon filled in the contact hole C. Additionally, the surface of the first polysilicon layer 3 may be nitrated in a later processing step.

Figure 2:
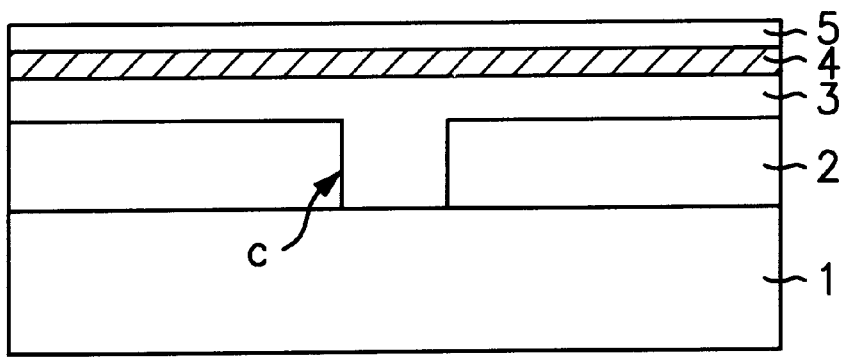

Then, as illustrated by FIG. 2, on the first polysilicon layer 3, a dielectric layer 4 is formed by a material selected from a group consisting of $Ta_2O_5$, $(Ba, Sr)TiO_3$, $(SrBi_2 Ta_2O_5)$ or $Pb(ZrT_{1-x})O_3$. In an ensuing step, a second polysilicon layer 5 is formed on the dielectric layer 4. It is preferable that the thickness of the polysilicon layer 4 has a range from 50 Å–500 Å.

Figure 3:
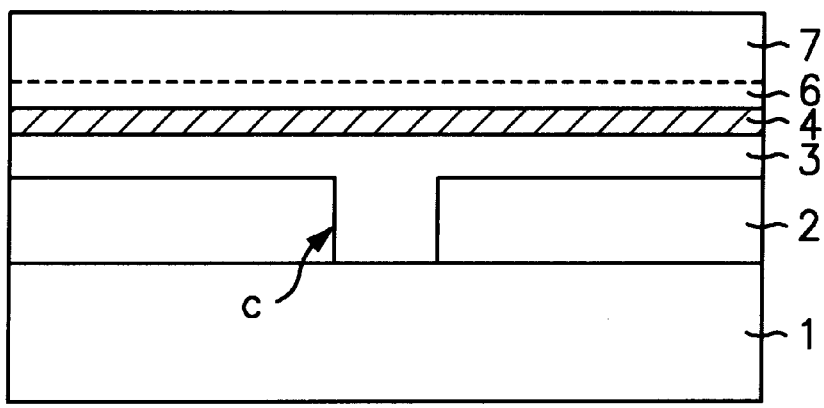

Then, as illustrated by FIG. 3, a tungsten seed layer 6 is formed on the dielectric layer 4 by the reduction of $WF_6$ with Si atoms of the second polysilicon 5, whereby the second polysilicon is conververted into the tungsten seed layer 6. In a following step, a tungsten film 7 is formed on the tungsten seed layer 6 by reacting $WF_6$ with hydrogen (H) or Silane ($SiH_4$).

Figure 4:
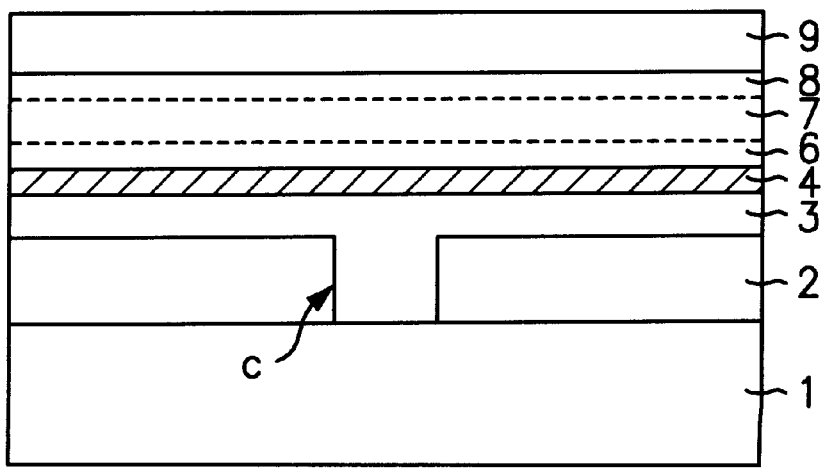

Then, as illustrated by FIG. 4, in order to prevent the formation of a tungsten silicide film on the tungsten film 7 in the following processes, a tungsten nitride film 8 is formed on the surface of the tungsten film 7 by a nitride process. The nitride process is performed by a thermal process at a temperature ranging from 500° C. to 900° C. in an ammonia gas or a nitrogen containing ambient or a plasma process using nitrogen or ammonia. Also, instead of depositing a tungsten nitride film, a diffusion barrier, such as TiN or $WN_x$, may be formed on the tungsten film 7 for preventing a tungsten silicide film from being formed in the following processes. Finally, a third polysilicon layer 9 is formed on the tungsten nitride film 8.

As described above, in accordance with the present invention, it can prevent a dielectric layer from being damaged in directly forming a tungsten film on the dielectric layer, and prevent a tungsten silicide film from being formed on the tungsten film by a nitride process, therefore, improve the reliability of a semiconductor device.

Although preferred embodiments of the present invention have been illustrated and described with respect to the particular capacitor having a simple laminated structure, the present invention will be applied to a capacitor having a complex lower electrode such as a trench or a cylinderical structure.

Therefore, the present invention is not intended to be limited by the recitation of preferred embodiments and the appended drawings, it will be understood by those skilled in the art that various changes in form and details may be made without departing from the sprit and scope of the invention as defined in the following claims.

What is claimed is:

1. A method for forming a capacitor of a semiconductor device, the method comprising the steps of:

forming a first polysilicon layer on a semiconductor substrate;

forming a $Ta_2O_5$ layer on the first polysilicon layer;

forming a second polysilicon layer on the $Ta_2O_5$ layer;

depositing $WF_6$ on the second polysilicon layer to form a tungsten nucleation layer on the $Ta_2O_5$ layer; and forming a tungsten layer on the tungsten seed layer.

2. The method of claim 1, further comprising the step of forming a tungsten nitride layer on the surface of the tungsten layer by a nitride process after the step of forming the tungsten layer.

3. The method of claim 2, wherein the second polysilicon layer is utilized as a sacrificial reduction layer.

4. The method of claim 2, wherein the tungsten nitride is formed by a thermal process of the tungsten layer at a temperature of 500° C.–900° C. in an ammonia or a nitrogen containing ambient or a plasma processing using a nitrogen gas or an ammonia gas.

5. The method of claim 2, wherein the tungsten nitride layer 15 is formed by performing a plasma process using a nitrogen gas or an ammonia gas.

6. The method of claim 1, further comprising the step of depositing a diffusion barrier on the tungsten layer after the step of forming the tungsten layer.

7. The method of claim 6, wherein the diffusion barrier is made of a TiN film or $WN_x$ film.

8. The method of claim 1, wherein the tungsten seed layer is formed by reducing $WF_6$ with the second polysilicon layer, whereby the second polysilicon layer is converted into the tungsten seed layer.

9. The method of claim 8, wherein the tungsten layer is formed by a deposition process in which $WF_6$ reacts with hydrogen (H) or silane ($SiH_4$).

10. The method of claim 8, wherein the $Ta_2O_5$ layer is made of a material selected from a group consisting of $Ta_2O_5$, (Ba, Sr)$TiO_3$, ($SrBi_2Ta_2O_9$) or Pb($ZrTi_{1-x}$)$O_3$.

11. The method of claim 10, wherein the second polysilicon has a thickness of 50 Å–500 Å.

12. The method of claim 1, wherein the lower electrode is a component selected from a group consisting of a simple laminated structure, a trench structure or a cylindrical structure.

* * * * *

UNITED STATES PATENT AND TRADEMARK OFFICE
CERTIFICATE OF CORRECTION

PATENT NO.  : 6,190,994 B1
DATED       : February 20, 2001
INVENTOR(S) : Seo

It is certified that error appears in the above-identified patent and that said Letters Patent is hereby corrected as shown below:

Title page,
Item [75], Inventor, please delete "Ichon" and insert -- Kyoungki-Do --.

Signed and Sealed this

Eighteenth Day of December, 2001

Attest:

Attesting Officer

JAMES E. ROGAN
Director of the United States Patent and Trademark Office